United States Patent
Smith et al.

(10) Patent No.: US 9,257,355 B2
(45) Date of Patent: Feb. 9, 2016

(54) METHOD FOR EMBEDDING A CHIPSET HAVING AN INTERMEDIARY INTERPOSER IN HIGH DENSITY ELECTRONIC MODULES

(71) Applicant: The Charles Stark Draper Laboratory, Inc., Cambridge, MA (US)

(72) Inventors: Brian Smith, Cambridge, MA (US); Maurice Karpman, Cambridge, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 14/177,595

(22) Filed: Feb. 11, 2014

(65) Prior Publication Data

US 2014/0225244 A1    Aug. 14, 2014

Related U.S. Application Data

(60) Provisional application No. 61/763,370, filed on Feb. 11, 2013.

(51) Int. Cl.
  *H01L 23/02*    (2006.01)
  *H01L 23/31*    (2006.01)
  *H01L 21/56*    (2006.01)
  *H01L 25/10*    (2006.01)

(52) U.S. Cl.
  CPC .......... *H01L 23/3121* (2013.01); *H01L 21/568* (2013.01); *H01L 25/105* (2013.01); *H01L 23/3128* (2013.01); *H01L 2225/1035* (2013.01); *H01L 2225/1058* (2013.01); *H01L 2924/0002* (2013.01)

(58) Field of Classification Search
  USPC .......... 257/266, 686, 712, 738, 777; 438/109
  See application file for complete search history.

(56) References Cited

U.S. PATENT DOCUMENTS

2013/0032390 A1*  2/2013  Hu et al. ................ 174/266

\* cited by examiner

*Primary Examiner* — Errol Fernandes
(74) *Attorney, Agent, or Firm* — Locke Lord LLP; Christopher J. Capelli; Alexander Viderman

(57) ABSTRACT

A method for creating a high density electronic module including the steps of coupling a die to an interposer for form a chipset, mounting the chipset to a substrate, coupling a wafer to the substrate so that the chipset is within a window formed in the wafer, filling the window with encapsulant to encapsulate the chipset, removing the substrate to create a reconstructed wafer, and providing an interconnection structure on the interposer to form the high density electronic module.

7 Claims, 5 Drawing Sheets

_US 9,257,355 B2_

METHOD FOR EMBEDDING A CHIPSET HAVING AN INTERMEDIARY INTERPOSER IN HIGH DENSITY ELECTRONIC MODULES

CROSS-REFERENCE TO RELATED APPLICATION

This application claims priority to U.S. Provisional Patent Application No. 61/763,370, filed Feb. 11, 2013, which is incorporated herein by reference.

TECHNICAL FIELD OF THE DISCLOSURE

The present technology relates generally to high density electronic modules, and, more particularly, to embedding an intermediary interposer in a 3-D electronic module.

BACKGROUND OF THE DISCLOSURE

High density electronic modules have been designed and fabricated to satisfy the increasing demand for high levels of functionality in small packages. Products that may be made from the modules include memory, digital logic, processing devices, and analog RF circuits, sensors, and the like.

Conventional fabrications of electronic modules can incorporate a chipset (e.g., a chip and a corresponding interposer) via surface mounting technology (SMT). The interposer is an electrical interface for routing between one socket or connection to another. The purpose of an interposer is to spread a connection to a wider pitch or to reroute a connection to a different connection. A chipset can be mounted to a printed circuit board (PCB). However, surface mounting the chipset to a PCB results in a non-planar topology and fails to include front-to-back electrical connections thereby limiting three dimensional stacking.

Other fabrication techniques include removing the interposer from the chipset and mounting the remaining chip directly to an embedded wafer level package (eWLP) module. However, once the interposer is removed, the complexity of connecting to high density pads that remain on the chip is a tedious process and can prove time consuming, costly, and even damaging if improper connections are made.

SUMMARY OF THE INVENTION

In view of the above, a need remains for improved fabrication techniques for incorporating chipset components into electronic modules.

In one embodiment, the subject technology is directed to a method for embedding chipset in a high density electronic module, wherein the chipset includes a die coupled to an interposer. The method includes the steps of mounting the chipset to a substrate, forming a window in a wafer, coupling the wafer to the substrate so that the chipset is within the window, encapsulating the chipset, removing the substrate to create a reconstructed wafer, and providing an interconnection structure on at least one side of the reconstructed wafer to form the high density electronic module. The method may also include providing through-substrate vias (TSVs) on the substrate within the window and electrically interconnecting the TSVs. The high density electronic module may be overmolded.

Further, the reconstructed wafer has a die side and an interposer side. During thinning of the die side, a wafer handle can be coupled to the interposer side for structural support and ease of handling.

In another embodiment, the subject technology is a method for creating a high density electronic module including the steps of coupling a die to an interposer to form a chipset, mounting the chipset to a substrate, coupling a wafer to the substrate so that the chipset is within a window formed in the wafer, filling the window with encapsulant to encapsulate the chipset, removing the substrate to create a reconstructed wafer, and providing an interconnection structure on the interposer to form the high density electronic module. The method may also include providing through-substrate vias (TSVs) within the encapsulant and electrically interconnecting the TSVs.

Another embodiment of the subject technology is directed to a high density electronic module component including a chipset including a die coupled to an interposer, a wafer defining a window surrounding the chipset, and encapsulant filling the window around the chipset, wherein at least a portion of the interposer is exposed. Preferably, the encapsulant and die have been thinned so that the die is exposed. The high density electronic module component can have a die side and an interposer side, with an interconnect structure coupled to the interposer side. A second interconnect structure may be coupled to the die side.

It should be appreciated that the present technology can be implemented and utilized in numerous ways, including without limitation as a process, an apparatus, a system, a device, a method for applications now known and later developed. These and other unique features of the technology disclosed herein will become more readily apparent from the following description and the accompanying drawings.

BRIEF DESCRIPTION OF THE DRAWINGS

So that those having ordinary skill in the art to which the disclosed technology appertains will more readily understand how to make and use the same, reference may be had to the following drawings.

DETAILED DESCRIPTION OF PREFERRED EMBODIMENTS

Figure 1:
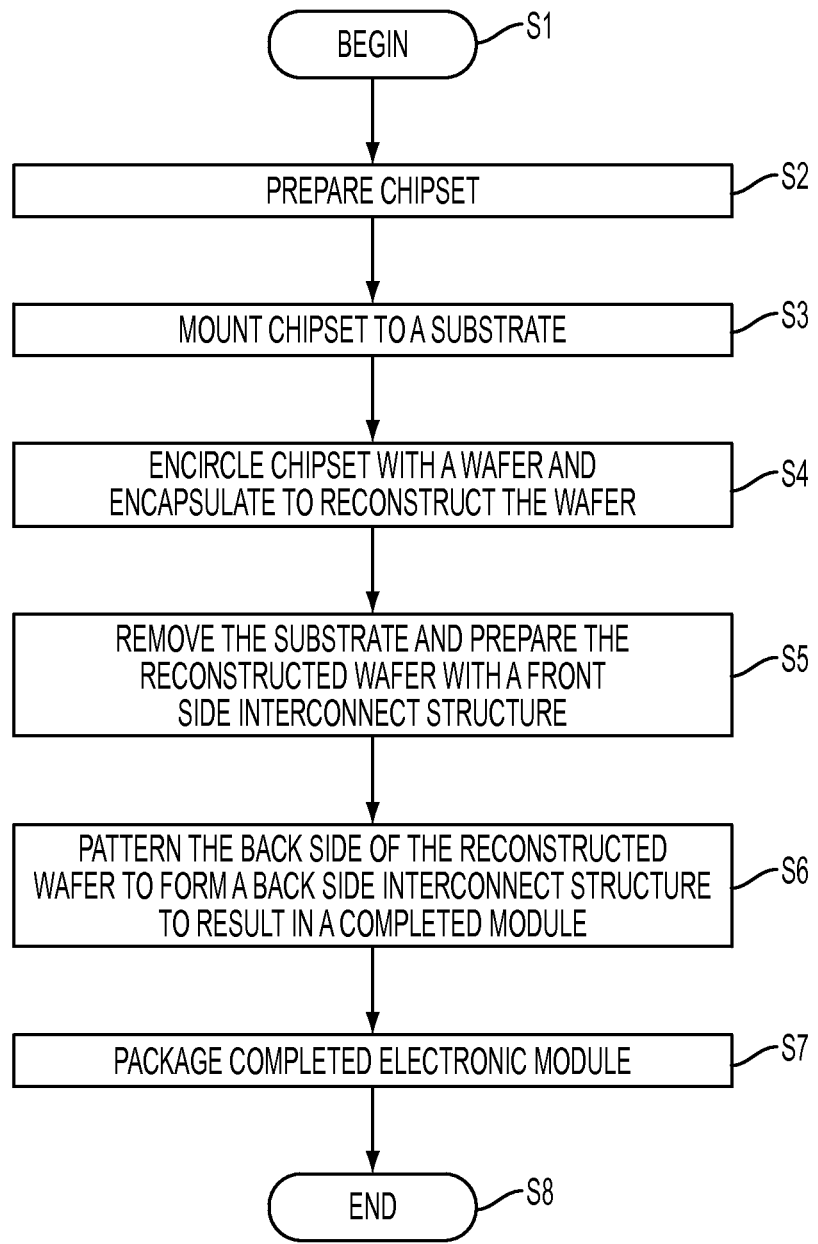
FIG. 1 is flowchart illustrating a method for manufacturing an electronic module in accordance with the subject technology.

The present disclosure overcomes many of the prior art problems associated with forming eWLP and other electronic packages. The advantages, and other features of the system disclosed herein, will become more readily apparent to those having ordinary skill in the art from the following detailed description of certain preferred embodiments taken in conjunction with the drawings which set forth representative embodiments of the present invention and wherein like reference numerals identify similar structural elements.

All relative descriptions herein such as top, bottom, side, left, right, up, and down are with reference to the Figures, and not meant in a limiting sense. Unless otherwise specified, the illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and unless otherwise specified, can be altered without materially affecting or limiting the disclosed technology.

In brief overview, the subject technology includes a method for embedding entire chips sets in a core of a high density electronics module to achieve extreme volume efficiency, modular integration of high complexity processor ships, and form factor compatibility for three dimensional packaging. The electronic modules can be formed using a composite wafer (e.g., a core) having various die (e.g., electronic modules) disposed therein. The chipsets preferably include embedded intermediary interposers.

Referring to FIG. 1, a flowchart 100 for illustrating a method for manufacturing an electronic module in accordance with the subject technology is shown. The flowchart 100 represents a series of steps S1-S8. Although the steps are shown in a particular order, the steps may be performed in various orders and include multiple intermediate steps as would be appreciated by those of ordinary skill in the art. At step S1, the flowchart or method 100 begins.

The method for embedding full chipsets (e.g., chips including interposers) includes mounting the chipset to a printed circuit board (PCB) so that the chipset becomes an intermediary interposer with final interposer functionality created with an eWLP-based electrical interconnect. Electronic modules can include wafers formed by fabricating (e.g., molding) a composite wafer with one or more embedded chip scale (e.g., a die) components disposed therein.

Figure 2:
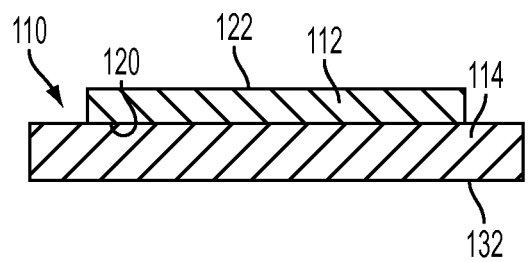
FIG. 2. is an initial cross-sectional view of chipset being manufactured in accordance with a method of the subject disclosure.

At step S2 of FIG. 1, a chipset 110 is prepared. Referring additionally to FIG. 2, it illustrates an initial cross-sectional view of the chipset 110. The chipset 110 includes a die 112 mounted to an interposer 114. In one example, the chipset 110 is a standard Intel Core i7 Processor in a 1023 ball grid array (BGA) package that has had the bumps/balls ground off. In another embodiment, a chipset that uses land grid array (LGA) attachment technology rather than BGA could preclude the need to remove bumps/balls. A typical thickness for the chipset is about 1.3 to 2.5 mm.

Figure 3:
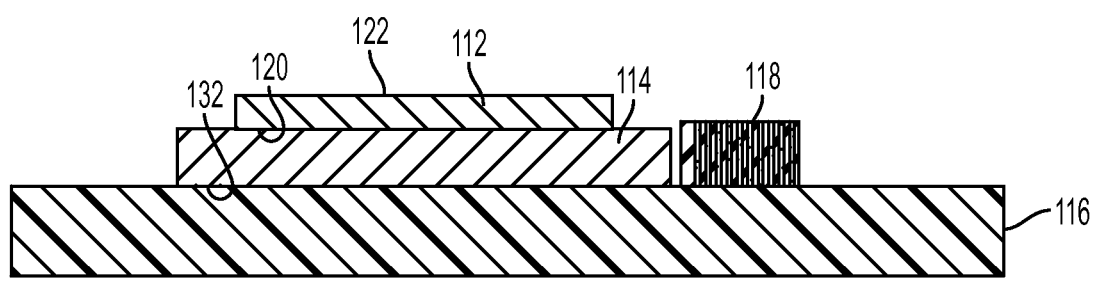
FIG. 3 is a cross-sectional view of the chipset of FIG. 2 after the chipset is mounted to a substrate.

At step S3 of FIG. 1, the chipset 110 is mounted to a substrate 116 as shown in FIG. 3. The chipset 110 is placed in an eWLP cavity with through-substrate vias (TSVs) 118. In effect, the chipset 110 is treat as a die. Although only a single chipset 110 is shown, a plurality of chipsets and other components (e.g., individual dies) may be placed onto the substrate 118 in similar and different manners. When the chipset is about 1.3 mm in thickness, a typical thickness for the TSVs is at least 0.9 mm.

The chipset 110 is placed on the substrate 116 with a front side 120 of the die 112 facing the substrate 116. The front side 120 of each die 112 typically includes pads (not explicitly shown) for electrical interconnection. For integrated circuits, the front side 120 is typically a surface that contains one or more active device components. Additionally, the substrate 116 is coated with an adhesive to keep the chipset 110 in place and to protect the chipset 110.

The TSVs form conductive paths that extend from the front side 120 of the chipset 110 to a back side 122 of the chipset 110. The conductive paths provide a means to electrically connect the front side interconnect structure 134 with the back side interconnect structure 138 of the finished module. The conductive paths typically include solid metal posts or insulating posts with a metal coating. In one embodiment, a height of the chipset is 1.3 mm.

Figure 4:
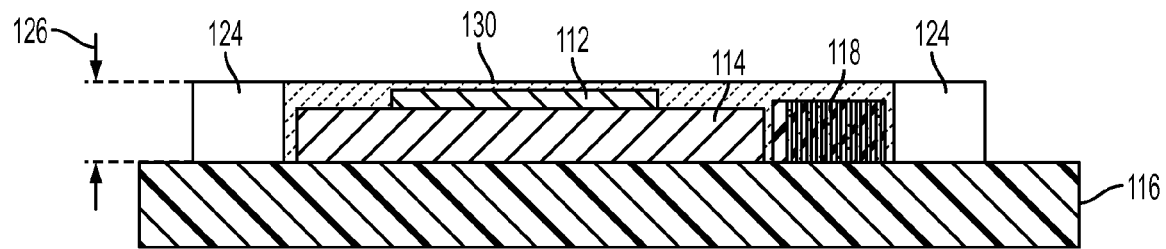
FIG. 4 is a cross-sectional view of the chipset of FIG. 2 after being encapsulated.

At step S4 of FIG. 1, the chipset 110 is surrounded by a wafer 124 and encapsulated as shown in FIG. 4. The wafer 124 defines a window 128 so that when the wafer 124 is placed against the substrate 116 over the chipset 110, the chipset 110 is fully within the window 130. The wafer 124 has a sufficient thickness 126 so that the when encapsulant 130 fills the window 130, the chipset 110 is completely covered as is the TSV 118. Preferably, the wafer 124 is Alumina (aluminum oxide) of at least 1.5 mm thickness (i.e., thicker than the chipset 110 at step S1).

To accomplish encapsulation, the encapsulant 130 (e.g., mold compound, epoxy, plastic, etc.) is formed against the substrate 116 for create a disc shape that refills the window 128. In effect, the wafer 124 is reconstructed albeit still attached to the substrate 116.

Figure 5:
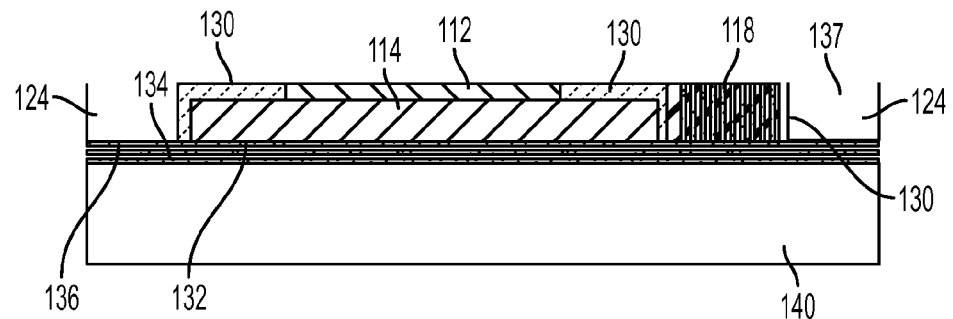
FIG. 5 is a cross-sectional view of the reconstructed wafer of FIG. 4 after removal of the substrate and formation of the front side interconnect structure.

At step 55 of FIG. 1, the substrate 116 is removed from the reconstructed wafer 124 as shown in FIG. 5. With the substrate 116 removed, a front side 132 of the chipset 110 is exposed so that a front side interconnect structure 134 can be formed thereon.

To form the front side interconnect structure 134, a dielectric layer (not shown explicitly) is applied to a front side 136 of the reconstructed wafer 124 (e.g., the front side 136 of the reconstructed wafer 124 contains the exposed chip set interposer 114). The front side 136 of the wafer 124 can be coated with a layer of dielectric material that is typically a liquid polymer applied by spin-coating or spray coating. Alternatively, the dielectric layer can be a polymer film that is laminated. Openings (not explicitly shown) are formed in the dielectric layer to expose the electrical interconnect pads (not explicitly shown) on the interposer 114 of the chipset 110. These openings can be photo-defined, ablated by a laser, and the like.

After the dielectric layer is formed, a metal layer (not explicitly shown) can be deposited on the dielectric layer such that the metal layer extends through the openings to connect the electrical interconnect pads of the chipset 110. Then, the metal layer is patterned to form the interconnect layer 132. The metal layer can be formed and patterned using, for example, etching processes, additive processes, and the like. The dielectric coating, metal deposition, and metal patterning can be repeated to form a multilayer interconnect layer 132. In one embodiment, the interconnect layer 132 is six metal layers but the interconnect layer 132 vary from one to many layers in formation.

Still referring to FIG. 5 and step S5 of FIG. 1, it is envisioned that once the front side interconnect structure 134 is completed, then the reconstructed wafer 124 can be prepared and oriented for easier further processing. In one embodiment, the reconstructed wafer 124 is attached to a handle wafer 140 to provide mechanical support during subsequent processing and to protect the front side interconnect structure 134. The attachment of the handle wafer 140 is typically done with a temporary bonding agent.

The reconstructed wafer 124 is thinned on the back side 137 to expose the electrical contacts (not explicitly shown) of the TSVs 118 for allowing electrical connection between the front side interconnect structure 134 and a back side interconnect structure 138 (described further below with respect to FIG. 6). Preferably, thinning through the silicon of the die 112 occurs for improved thermal access. The thinning also reduces the overall thickness of the resulting electronic module. When the chipset is about 1.3 mm in thickness at step S1, a typical thickness for the chipset after step S5 is about 0.8 mm. It would be appreciated that the subject technology could be completed re-orienting the wafer as needed.

Figure 6:
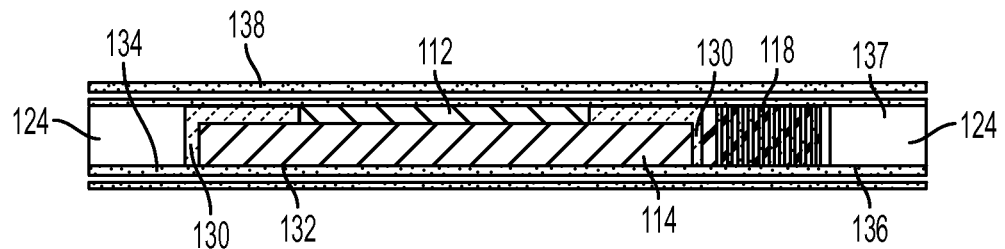
FIG. 6 is a cross-sectional view of the reconstructed wafer of FIG. 5 after patterning to form the back side interconnect structure.

At step S6 of FIG. 1, a back side interconnect structure 138 is applied to the back side 136 of the reconstructed wafer 124 as shown in FIG. 6. As discussed above with respect to the front side dielectric structure 134, the back side 136 of the reconstructed wafer 124 is coated with a dielectric layer, followed by a metal layer, and patterning to form the back side interconnect structure 138. Once the back side interconnect structure 138 is formed, the handle wafer 140, if used, is removed to result in a completed electronic module 142. In another embodiment, the back side interconnect structure 138 is not needed. Further depending upon the application, the resulting electronic modules can include solder balls attached to one or both of sides of the reconstructed wafer. Still further, the electronic module, once completed, can be further attached to a next level of interconnect (e.g., a printed circuit board (PCB)). The electronic module 142 can also he diced and further packaged.

Figure 7:
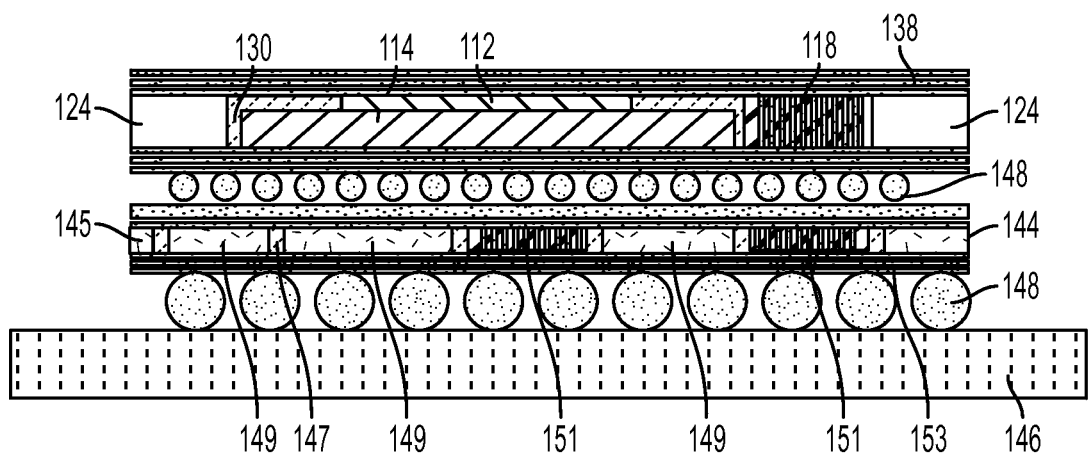
FIG. 7 is a cross-sectional view of the completed electronic module FIG. 6 having undergone further processing.

At step S7 of FIG. 1, the completed electronic module 142 is further packaged for specific applications and the method 100 ends at step 58. Referring now to FIG. 7, one embodiment of a further processed electronic module 142 is shown. The electronic module 142 is stacked with other component layers 144 and mounted to a board 146 using BGA 148 or other known techniques. The stacking order is determined with consideration for thermal dynamics, architecture, vertical I/O, volume protection, and the like. As can be seen in FIG. 7, the other component layer 144 includes a wafer 145, encapsulant 147, a plurality of die 149, a plurality of TSVs 151, and interconnect structure 153, which can be fabricated using the subject technology.

Figure 8:
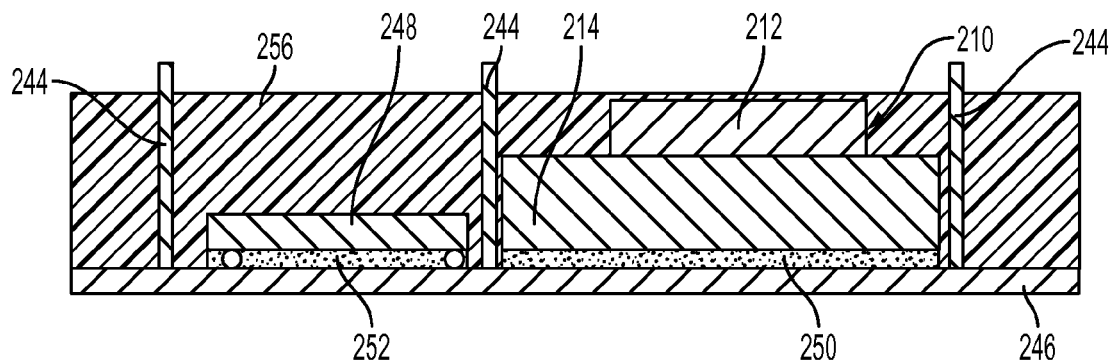
FIG. 8 is a cross-sectional view of a completed electronic module similar to that of FIG. 6 having undergone further processing.

Referring now to FIG. 8, another embodiment of the subject technology is shown as electronic module 242. As will be appreciated by those of ordinary skill in the pertinent art, the electronic module 242 is similar to the electronic module 142 described above, Accordingly, like reference numerals preceded by the numeral "2" instead of the numeral "1", are used to indicate like elements. The primary difference of the electronic module 242 in comparison to the electronic module 142 is that the front side interconnect 134 is replaced with interconnect pre-fabricated in the full thickness substrate and the TSV die 118 is replaced with free end wire bonds 244.

The electronic module 242 is mounted on a full thickness substrate 246 along with free end wire bonds 244. The free end wire bonds 244 are exposed when the encapsulation 256 is thinned in FIG. 9. Optionally, other die or components such as a bumped die 248 are included in the electronic module 242. Additional interposers 250, 252 may be used with the electronic module 242 and die 248 to provide electrical connection to the interconnect in the full thickness substrate 246 or the chipset 242 and die 248 may be electrically connected to the interconnect in the full thickness substrate 246 by direct solder connection or other means. The electronic module 242 and other components are overmolded with a mold compound 256.

Figure 9:
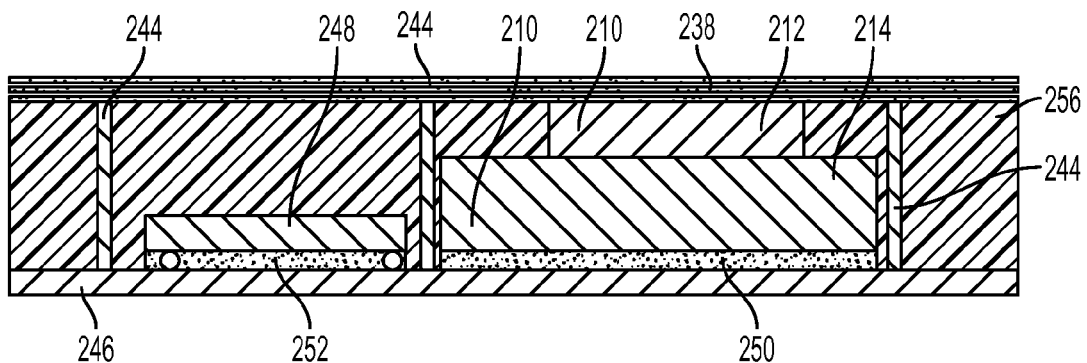
FIG. 9 is a cross-sectional view of the completed electronic module of FIG. 8 after thinning.

Referring now to FIG. 9, the electronic module 242 of FIG. 8 is shown after thinning of the mold compound 256 to expose the ends of the free end wire bonds 244. A back side interconnect structure 238 is subsequently formed on the back side of the electronic module 242. The back side interconnect structure 238 is electrically connected to the exposed ends of the free end wire bonds 244. Depending upon the application, the resulting electronic module 242 can include solder balls attached to either the front side of the full thickness substrate or to the back side interconnect structure 238. Still further, the electronic module, once completed, can be further attached to a next level of interconnect (e.g., a printed circuit board (PCB)). The electronic module 242 can also be diced and further packaged.

As can be seen in FIG. 9, the subject technology includes both non-interposer based die 248 along with the interposer based die 212 of the chipset 210. As can be seen, the subject technology has many advantages. It is envisioned that over molding can be used to create a reconstructed wafer instead of using a cavity wafer. Using a reconstructed wafer avoids wafer bow issues (e.g., using a thick ceramic substrate can be used for stiffness). As described above, TSVs as well as free-end wire bonds can be used to create the front-to-back interconnects. Advantageously, the free end wire bonds can be placed anywhere, which may be critical for high frequency designs.

For further examples of the subject technology, die with bumps could be placed, face up, on the top surface of the interposer, adjacent to the microprocessor die, such that the bumps are exposed during the thinning of the mold compound. Embedding complex chipsets (e.g., processor chips including corresponding interposers) in a reconstructed wafer provides for extreme volume efficiency and compatible form factor for vertical stacking as shown in FIG. 7. These embedding techniques also allow module designers to electrically interface to relatively large, limited number of pads on the corresponding interposer board instead of a smaller, much more numerous pads on the bare chip itself (e.g.,. <10× size area and a >5× pad count). These embedding techniques also leverage the significant engineering that goes into design of an interposer in terms of signal quality and stress relief and therefore can yield cost savings in terms of reduced-non recurring engineering (NRE) required to implement a given chip.

As can be seen, the subject technology may be utilized to create a variety of electronic packages. As would be appreciated by those of ordinary skill in the pertinent art, the subject technology is applicable to use in a wide variety of applications. The functions of several elements may, in alternative embodiments, be carried out by fewer elements, or a single element. Similarly, in some embodiments, any functional element may perform fewer, or different, operations than those described with respect to the illustrated embodiment. Also, functional elements (e.g., layers) shown as monolithic for purposes of illustration may be incorporated within other functional elements, separated or distributed in various ways in a particular implementation. Further, relative size and location are merely somewhat schematic and it is understood that not only the same but many other embodiments could have varying depictions.

It should be noted that while a particular order of the steps is described above, this ordering is merely illustrative, and any suitable arrangement of the steps may be utilized without departing from the scope of the embodiments herein. Moreover, while the additional techniques are described separately, certain steps from each procedure may be incorporated into each other procedure, and the procedures are not meant to be mutually exclusive.

While the invention has been described with respect to preferred embodiments, those skilled in the art will readily appreciate that various changes and/or modifications can be made to the invention without departing from the spirit or scope of the invention. For example, each claim may depend from any or all claims, even in a multiple dependent manner, even though such has not been originally claimed.

What is claimed is:

1. A high density electronic module component comprising:
    a chipset including a die coupled to an interposer, the chipset, the die and the interposer together having a first thickness;
    a wafer defining a window surrounding the chipset, the wafer having a second thickness defined by a top surface and a bottom surface of the wafer, the window extending depthwise from the top surface to the bottom surface of the wafer, wherein the first thickness does not exceed the second thickness; and
    encapsulant filling the window around the chipset, wherein at least a portion of the interposer is exposed.

2. A high density electronic module component as recited in claim 1, wherein the encapsulant and die have been thinned so that the die is exposed.

3. A high density electronic module component as recited in claim 1, wherein the high density electronic module component has a die side and an interposer side, and further comprising a first interconnect structure coupled to the interposer side.

4. A high density electronic module component as recited in claim 3, further comprising:
    through substrate vias (TSVs) within the window; and
    a second interconnect structure coupled to the die side and electrically connected to the TSVs.

5. A high density electronic module component as recited in claim 1, further comprising preformed interconnects in a full thickness substrate.

6. A high density electronic module component as recited in claim 1, further comprising free end wire bonds for completing electrical connections.

7. A high density electronic module component as recited in claim 1, wherein the encapsulant is completely filling the window around the chipset.

* * * * *